US012756379B2

(12) United States Patent
Katsaros et al.

(10) Patent No.: US 12,756,379 B2
(45) Date of Patent: Oct. 6, 2026

(54) ADAPTIVE FILTER DEVICE AND METHOD FOR PROVIDING AN OUTPUT SIGNAL

(71) Applicant: u-blox AG, Thalwil (CH)

(72) Inventors: Nikolaos Katsaros, Maroussi (GR); Olivier Julien, Thalwil (CH); Giorgos Tzimas, Maroussi (GR); Evangelos Stefatos, Maroussi (GR)

(73) Assignee: u-blox AG, Thalwil (CH)

( * ) Notice: Subject to any disclaimer, the term of this patent is extended or adjusted under 35 U.S.C. 154(b) by 318 days.

(21) Appl. No.: 18/393,143

(22) Filed: Dec. 21, 2023

(65) Prior Publication Data

US 2024/0213960 A1 Jun. 27, 2024

(30) Foreign Application Priority Data

Dec. 22, 2022 (EP) .................................... 22215947

(51) Int. Cl.
*H03H 21/00* (2006.01)
*H03H 17/02* (2006.01)
*H03H 17/00* (2006.01)

(52) U.S. Cl.
CPC ........ *H03H 21/0021* (2013.01); *H03H 17/02* (2013.01); *H03H 2017/0081* (2013.01)

(58) Field of Classification Search
CPC . H03H 21/00; H03H 17/02; H03H 2017/0081
See application file for complete search history.

(56) References Cited

U.S. PATENT DOCUMENTS 4,513,429 A * 4/1985 Roeder ................. H03L 7/1077 375/321
6,219,376 B1 * 4/2001 Zhodzishsky ........... G01S 19/21 455/306

(Continued)

FOREIGN PATENT DOCUMENTS

EP 2711735 B1 * 10/2018 ........... H04B 1/7097
WO WO-2022082206 A1 * 4/2022 ............. H04B 1/123
WO WO-2021247584 A9 * 2/2023 ............. G01S 19/30

OTHER PUBLICATIONS

Extended European Search Report in European Appln. No. 22215947.7, mailed on Jun. 15, 2023, 9 pages.

(Continued)

*Primary Examiner* — Hai V Nguyen
(74) *Attorney, Agent, or Firm* — Fish & Richardson P.C.

(57) ABSTRACT

An example adaptive filter structure comprises a detector circuit configured to receive an input signal (Sin), to detect a presence of a sweeping interference in the input signal, and upon detection of such sweeping interference to provide a first trigger signal (T1) to a delay circuit. The first trigger signal (T1) comprises a first frequency indication (f1). The delay circuit is configured, upon receiving the first trigger signal (T1), to provide a second trigger signal (T2) to a tracker circuit after an adjustable amount of time. The tracker circuit is configured, upon receiving the second trigger signal (T2), to estimate a frequency of the sweeping interference using a second frequency indication (f2), to track the estimated frequency and provide the estimated frequency as a third frequency indication (f3) to a notch filter circuit. The notch filter circuit is configured to substantially eliminate the sweeping interference from the input signal (Sin) using the third frequency indication (f3) and therefrom provide an output signal (Sout).

19 Claims, 4 Drawing Sheets

(56) References Cited

U.S. PATENT DOCUMENTS

| | | | | |
|---|---|---|---|---|
| 6,512,803 | B2 * | 1/2003 | Heinzl | H04B 1/7102 455/63.2 |
| 8,693,598 | B2 * | 4/2014 | Subburaj | H04B 1/7097 375/346 |
| 9,036,740 | B2 * | 5/2015 | Khoury | H03D 1/04 455/278.1 |
| 9,291,715 | B2 * | 3/2016 | Wang | H04B 1/1036 |
| 10,263,727 | B2 * | 4/2019 | Hudson | H04B 1/109 |
| 10,340,962 | B2 * | 7/2019 | Utter | H04B 1/1036 |
| 11,570,719 | B2 * | 1/2023 | Abdelmonem | H04W 72/542 |
| 11,582,763 | B2 * | 2/2023 | Abdelmonem | H04W 4/02 |
| 11,601,149 | B2 * | 3/2023 | Goodman | H04B 1/1036 |
| 11,638,268 | B2 * | 4/2023 | Abdelmonem | H04W 4/02 455/422.1 |
| 11,728,912 | B2 * | 8/2023 | Abdelmonem | H04B 17/336 455/63.1 |
| 2004/0062278 | A1 * | 4/2004 | Hadzic | H04J 3/0667 370/503 |
| 2005/0002474 | A1 * | 1/2005 | Limberg | H04L 25/03057 375/321 |
| 2011/0038407 | A1 * | 2/2011 | Ki | H04L 25/03305 375/232 |
| 2013/0034127 | A1 * | 2/2013 | Subburaj | G01S 19/21 375/E1.02 |
| 2013/0308656 | A1 * | 11/2013 | Malkin | H04L 27/2621 370/537 |
| 2014/0106697 | A1 * | 4/2014 | Wang | H04B 1/7101 455/307 |
| 2014/0376651 | A1 * | 12/2014 | Khoury | H03D 1/04 375/261 |
| 2017/0324434 | A1 * | 11/2017 | Utter | H04B 1/1036 |
| 2018/0013514 | A1 * | 1/2018 | Hudson | H04B 1/1036 |
| 2018/0115328 | A1 * | 4/2018 | Kuan | H04B 14/062 |

OTHER PUBLICATIONS

Kang et al., "Global navigation satellite system interference tracking and mitigation based on an adaptive fading Kalman filter," IET Radar, Sonar & Navigation, Oct. 1, 2015, 9(8):1030-1039.

* cited by examiner

ADAPTIVE FILTER DEVICE AND METHOD FOR PROVIDING AN OUTPUT SIGNAL

CROSS-REFERENCE TO RELATED APPLICATION(S)

This application claims priority to European Application No. 22215947.7, filed on Dec. 22, 2022, the contents of which are incorporated herein by reference in their entirety.

TECHNICAL FIELD

The present disclosure relates to the field of wireless communication, especially to receiving radio frequency signals. Specifically, the disclosure is directed to an adaptive filter device and a method for providing an output signal.

BACKGROUND

In the field of wireless communication involved devices use increasingly complex receiver circuits to take account of ever more functionality and high data rates, for example. Such receivers may be employed in various electronic devices, like mobile phones or Global Navigation Satellite Signal devices. In each case, a radio frequency, RF, signal having well-defined—often standardized—characteristics forms the basis for transmission of information. Transmission of RF signals is subject to interference. Therefore, state of the art receivers for RF signals implement countermeasures to ensure successful receipt of the transmitted signal for enabling correct decoding of the conveyed information.

Interference refers to undesired electromagnetic energy, which influences functioning of electronic systems. It manifests as degraded performance of an affected system. An example of interference is noise. Another example is known as sweeping interference, or sweeping frequency interference, i.e. an interference with varying frequency.

One known possibility to counteract interference is to provide special filters in a receiver, for instance a notch filter. A notch filter is generally used to reject a particular frequency from a system by passing only the frequency components below and above said particular frequency, which is also called notch frequency. In order to properly fulfil its task, a notch filter must be tuned to the frequency and bandwidth of the interference. In case this frequency is not fixed or well-known, it has to be detected and tracked. For a sweeping interference this undertaking is even more challenging.

A sweeping interference is typically a very narrow band interference with a frequency that can have a very high dynamic. It might as well be intermittent or have frequency jumps. The mechanism to mitigate its effect thus generally requires a combination of detection, tracking, and elimination, which can be gathered under the structure of a so-called adaptive notch filter. When such sweeping interference starts or has frequency jumps or is intermittent, this creates the necessity for the adaptive notch filter to detect the new interference frequency, reset the tracking circuit (if appropriate) and eliminate the interference promptly. It is important that this is done very fast as the interference might very quickly come close to the signal of interest due to its high dynamic (thus maximizing harm), or might very quickly jump to a different frequency (preventing proper elimination if that is achieved before the interference is accurately tracked by the tracking circuit). The adaptive notch filter might thus need to reset its interference tracking circuit regularly. In the case where the tracking circuit provides an estimate of the interference that is delayed, this might result in the inability of the adaptive notch filter to remove the interference at the beginning and/or the end of its continuous period i.e. at the beginning and/or the end of the period during which the tracking circuit tracks the interference frequency without any reset.

Providing a device that maximizes the elimination of the sweeping interference, whether it is continuous or intermittent or has frequency jumps, is then an objective of great importance.

The objective is achieved by the subject-matter of the independent claims. Embodiments and developments are defined in the dependent claims.

The definitions provided above also apply to the following description unless stated otherwise.

SUMMARY

In one embodiment an adaptive filter device comprises a detector circuit, a delay circuit, a tracker circuit and a notch filter circuit. The detector circuit is configured to receive an input signal, to detect a presence of a sweeping interference in the input signal, and upon detection of such a sweeping interference the detector circuit is configured to provide a first trigger signal to the delay circuit. The first trigger signal comprises a first frequency indication. The delay circuit is configured, upon receiving the first trigger signal, to provide a second trigger signal to the tracker circuit after an adjustable amount of time, the second trigger signal having a second frequency indication, which is derived from the first frequency indication. The tracker circuit is configured, upon receiving the second trigger signal, to estimate a frequency of the sweeping interference using the second frequency indication, to track the estimated frequency and provide the estimated frequency as a third frequency indication to the notch filter circuit. The notch filter circuit is configured to substantially eliminate the sweeping interference from the input signal using the third frequency indication and therefrom provide an output signal.

The detector circuit receives the input signal, which contains a wanted signal transmitting information and an interference signal. As soon as such sweeping interference is detected, and if this detection is indicative of, for instance, the initiation of a sweeping interference or a frequency jump of the said interference, the first trigger signal having the first frequency indication, or frequency information, is provided to the delay circuit. Said first trigger signal is propagated after the adjustable amount of time to the tracker circuit as the second trigger signal. When the tracker circuit receives this second trigger signal, it estimates or acquires the frequency of the sweeping interference on the basis of the second frequency indication. The acquired or estimated frequency is then tracked and provided as the third frequency indication or information to the notch filter circuit. On the basis of this third frequency indication, the notch filter circuit largely or substantially eliminates the sweeping interference from the input signal and provides the output signal therefrom.

By delaying the start of the tracker circuit, i.e. by means of the delay circuit which defers or delays triggering the tracker circuit after detection of the sweeping interference, substantially immediate tracking of the interference is enabled. Consequently, a greater percentage of the sweeping interference is tracked and hence eliminated. Furthermore, an improved coverage of the sweeping interference and a better resistance to the sweeping interference are achieved. Especially, an improved coverage of the end of the interference tracking can be achieved, particularly in the case where the tracking circuit provides a delayed output.

The wording “substantially eliminate” or “largely eliminate” means that most of the sweeping interference signal is removed from the input signal. This also includes the case in which the sweeping interference is completely removed from the input signal.

The second frequency information is derived from the first frequency information, for example, in that it is adapted according to the adjustable amount of time. In another example, the second frequency information coincides with the first frequency information.

In a development, the sweeping interference is represented by an interference signal which comprises a sweeping frequency which increases or decreases. The interference signal is comprised by the input signal. Optionally, the interference signal additionally comprises a frequency reset event from which the sweeping interference increases or decreases. Optionally, the interference may be continuous or intermittent, i.e. “on” and “off”.

The optional frequency reset event may occur regularly at a certain frequency or it may occur irregularly. In other words, the interference signal optionally has one or more frequency jumps, each jump being also referred to as the reset event, which occur regularly or irregularly. Between these jumps or reset events the frequency of the interference signal varies in a continuous way by going up, i.e. by increasing, and/or by going down, i.e. by decreasing.

The interference of the interference signal may also be called a chirping interference. The interference is consequently not static, but sweeping.

In a development, the delay circuit is further configured to initialize the tracker circuit during the adjustable amount of time. The adjustable amount of time is thereby used for initializing the tracker circuit.

The tracker circuit is initialized by using the first frequency information, for example, and accordingly setting the parameters of the tracker circuit.

In a development, the adjustable amount of time is realized as a predefined amount of time. In an alternative, the adjustable amount of time is adjusted depending on at least a computation and delay time needed by the tracker circuit.

The amount of time for which propagation of the first trigger signal is delayed may be implemented as a predefined amount of time in milliseconds or microseconds or a number of cycles of a clock signal used in the filter device according to experimental measurement results determined beforehand. Alternatively, the computation and delay time needed by the tracker circuit is used which includes the time to compute an initial tracker discriminator, for example. The computation and delay time is caused by various tasks of the tracker circuit which basically comprise: Mixing the input signal down to baseband, filter this baseband signal, calculate a discriminator, pass the resulting signal through the loop filter, calculate the estimation of the tracking frequency and generate a new NCO frequency.

In a development the detector circuit comprises a number of filters, in particular low-pass filters, which jointly cover the spectrum of the input signal and are configured to scan the spectrum of the input signal. The detector circuit further comprises a detection circuit which is coupled downstream of the filters. The detection circuit is configured to detect a speed of change of the sweeping interference.

In a development a frequency of a specific filter of said number of filters, which specific filter detects the presence of the sweeping interference, together with an output of the downstream connected detection circuit, are used as the first frequency indication.

In other words, the detector circuit comprises a bank of filters which are distributed across the bandwidth of the input signal, thereby covering most of the spectrum of the input signal or the complete spectrum of the input signal. The filters may be realized as Infinite Impulse Response, IR, filters or as low-pass filters. Based on the output of these filters, the presence of the sweeping interference in one of these filters is detected. The detection circuit may provide the information whether the sweeping interference sweeps fast or slow. The frequency, e.g. a central frequency, of the filter which detected the sweeping interference, i.e. the triggering filter, together with the output of the detection circuit, form the first frequency indication. If a difference between the frequency of the triggering filter and the tracked interference frequency is greater than a predefined, programmable threshold, a frequency reset event has been detected. In case the tracking circuit was inactive, an initial detection has taken place. The adaptive filter device consequently begins to take care of the interference at the start of the interference or after an interruption.

In a development the tracker circuit is realized as a frequency locked loop, FLL, which is configured to receive the input signal or a delayed version of the input signal. The FLL is further configured according to the second frequency information. Operation of the FLL is started upon receiving the second trigger signal.

Tracking of the sweeping interference is hereby based on the FLL, which tracks the frequency of the interference. A reaction time of the loop may be set according to the speed information provided by the first frequency indication, i.e. by taking into account whether the sweeping interference sweeps fast or slow. According to a classical FLL structure known to those skilled in the art, in the first step the tracker circuit reduces the level of noise coming with the sweeping interference so that interference with low power can still be tracked. Then as known to the skilled reader, the FLL tracks the frequency of the sweeping interference and accordingly outputs the third frequency indication. Consequently, a sweeping interference can be tracked from the very beginning, i.e. its reset point.

In a development, the FLL may be designed to output the third frequency indication so that it corresponds to the current or a past epoch or sample.

In a development, the notch filter circuit comprises a finite impulse response, FIR, filter, which is configured to receive the input signal or a delayed version of the input signal. The FIR filter is further configured to filter the input signal or its delayed version according to the third frequency indication.

In an exemplary implementation, the third frequency indication represents the notch frequency. The notch filter circuit consequently filters components located at and/or in the region of the frequency indicated by the third frequency indication.

In a development the input signal and the output signal each comprise a number of samples corresponding to a radio frequency signal. Each sample comprises an in-phase value I and a quadrature value Q, forming an I/Q-sample.

The radio frequency signal may be in an RF or in an intermediate or in a baseband frequency range.

In a development, the adaptive filter device further comprises a detector delay circuit. The detector delay circuit is configured to delay the input signal according to a detector processing time needed by the detector circuit, and to provide a signal resulting therefrom as a first delayed input signal to the tracker circuit.

In an exemplary implementation the detector processing time is defined as the sum of a group delay of the filters, in particular low-pass filters, of the detector circuit and the time needed by the detection circuit. Additionally, the time needed for calculations performed in the detector circuit, like instantaneous power calculation, multiplications with thresholds and comparisons, is taken into account.

In a development the adaptive filter device comprises a tracker delay circuit, which is configured to delay the first delayed input signal according to the computation and delay time needed by or associated to the tracker circuit and to provide a signal resulting therefrom as a second delayed input signal to the notch filter circuit. The first delayed input signal is a delayed version of the input signal.

In an implementation example, the computation and delay time comprises the time needed for calculating a discriminator, i.e. an estimate of the frequency tracking error, and a step size of an oscillator used in the notch filter circuit based on the frequency which is estimated for the sweeping interference.

The first and the second delayed input signal each represent a delayed version of the input signal.

In a development the adaptive filter device further comprises a delay control circuit, which is coupled between the detector circuit, e.g. its output, and the delay circuit, e.g. its input. The delay control circuit is configured to adjust the adjustable amount of time used in the delay circuit in dependence on a relationship between a frequency of the sweeping interference and a wanted signal and in dependence on a presence of a reset event within the sweeping interference. The sweeping interference, e.g. its frequency, and the wanted signal, e.g. its frequency, are both comprised by the input signal, e.g. a bandwidth thereof.

In an exemplary implementation, the sweeping interference is detected to comprise one or more reset events. The delay control circuit consequently checks whether a frequency of the reset event is just above or just below the frequency of the wanted signal and accordingly adjusts the adjustable amount of time in the delay circuit.

In an embodiment a receiver for a radio frequency signal comprises the adaptive filter device as defined above.

The receiver for the RF signal, or the RF receiver in short, is consequently enabled to better eliminate a sweeping interference from a received signal considering that the sweeping interference can be continuous or intermittent or have frequency jumps.

In a development, the receiver is realized as a global navigation satellite system, GNSS, receiver or as a receiver for wireless communication.

The wanted signal in this case is a GNSS signal.

The receiver may consequently be implemented in any sort of handheld device, in a vehicle or any other appliance which is enabled to receive RF signals.

In an embodiment a method for providing an output signal comprises the following steps:

- receiving an input signal,
- detecting a presence of a sweeping interference in the input signal,
- providing a first trigger signal upon detection of such sweeping interference, wherein the first trigger signal comprises a first frequency indication,
- waiting for an adjustable amount of time and then providing a second trigger signal having a second frequency indication, which is derived from the first frequency indication,
- estimating a frequency of the sweeping interference using the second frequency indication upon receiving the second trigger signal,
- tracking the estimated frequency and providing the estimated frequency as a third frequency indication,
- substantially eliminating the sweeping interference from the input signal using the third frequency indication and therefrom providing the output signal.

By means of the proposed method, a sweeping interference can be removed from the input signal to a higher percentage.

The method may be implemented by the adaptive filter device, which is described above. The adaptive filter device so to say adapts to the sweeping interference in order to eliminate most or all of it from the input signal.

BRIEF DESCRIPTION OF THE DRAWINGS

The text below explains the proposed solution in detail using exemplary embodiments with reference to the drawings. Components and elements that are functionally identical or have an identical effect bear identical reference numbers. Insofar as parts or components correspond to one another in their function, a description of them will not be repeated in each of the following figures. Therein.

DETAILED DESCRIPTION

Figure 1:
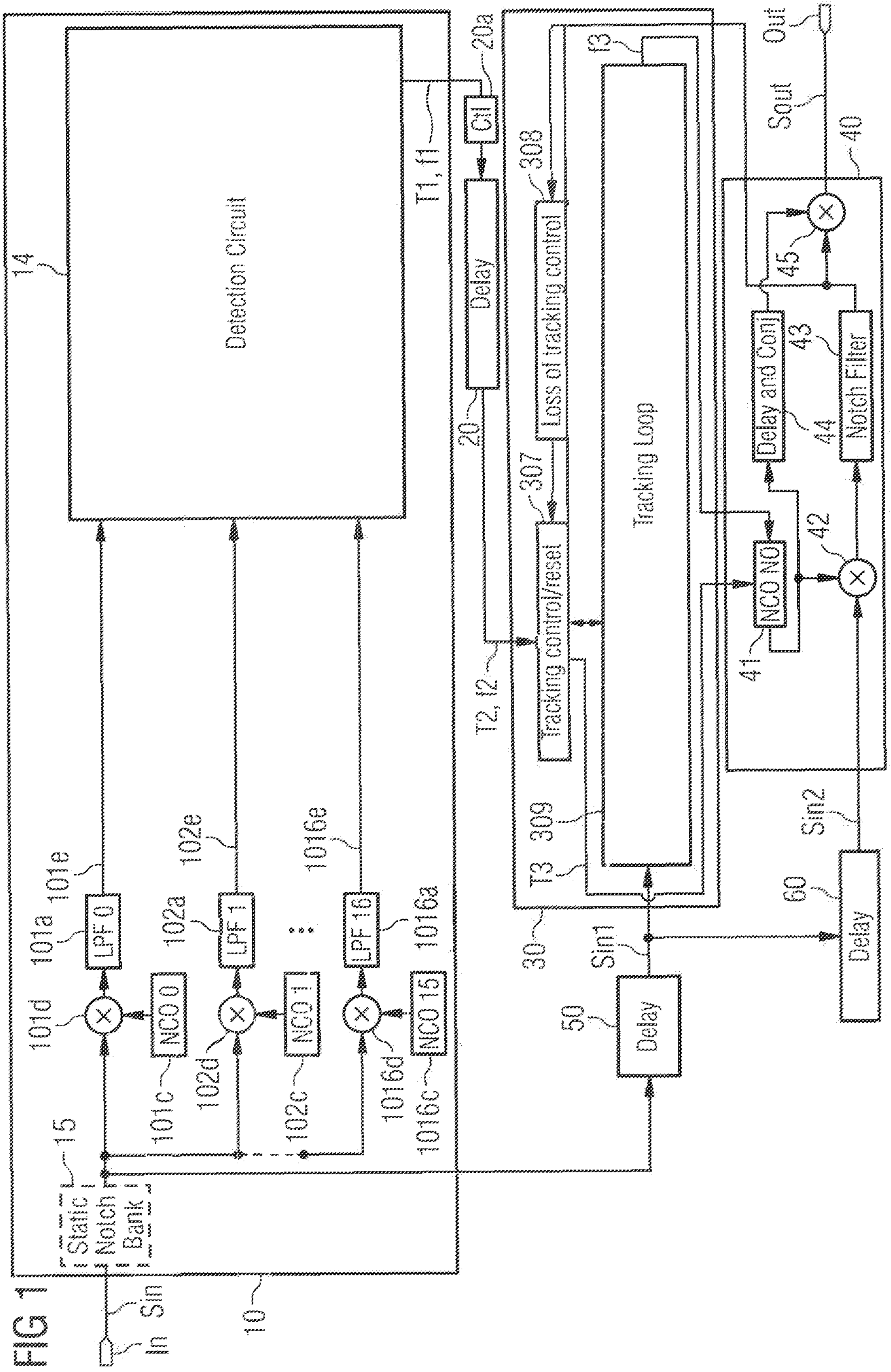
FIG. 1 shows an embodiment example of an adaptive filter device as proposed.

FIG. 1 shows an embodiment example of an adaptive filter device as proposed. The adaptive filter device comprises an input In for receiving an input signal Sin, a detector circuit 10, a delay circuit 20, a tracker circuit 30, a notch filter circuit 40, and an output Out at which an output signal Sout is provided.

The detector circuit 10 is configured to receive the input signal Sin, to detect a presence of a sweeping interference, e.g. by scanning a spectrum of the input signal Sin or to detect a reset event in the sweeping interference. Upon detection of such sweeping interference or such reset event the detector circuit 10 is configured to provide a first trigger signal T1 to the delay circuit 20.

In order to fulfil this task, the detector circuit 10 comprises a number of filters 101*a*, 102*a*, . . . , 1016*a*, which, in the depicted example, are realized as low-pass filters, LPFs, and are jointly covering the spectrum of the input Sin. For splitting up the spectrum of the input signal Sin into different frequency ranges which are analyzed separately, the number of filters 101*a*, 102*a*, . . . , 1016*a* are arranged in parallel forming the bank of filters. Each filter provides a filtered portion 101*e*, 102*e*, . . . , 1016*e*, of the input signal Sin at its output. For this, the input signal Sin is mixed or, in a complex way, multiplied in mixers 101*d*, 102*d*, . . . , 1016*d* with a signal provided by a numerically controlled oscillator, NCO. Each of these mixers has one accorded NCO 101*c*, 102*c*, . . . , 1016*c*, which provides a signal with a different frequency in relation to its neighbouring NCO. Each of the filtered signals containing a portion 101*e*, 102*e*, . . . , 1016*e* of the input signal Sin is provided to a detection circuit 14, which amongst others may determines whether the sweeping interference sweeps fast or slowly, processes the number of detections per band and generates a corresponding output signal. At an output of the detection circuit 14, which represents an output of the detector circuit 10, a first trigger signal T1 is provided. The first trigger signal T1 indicates a specific event that may influence the tracking circuit settings, such as the detection of a frequency jump or the start of sweeping interference. Alternatively, the first trigger signal T1 can be output with every relevant detection and the decision on using this trigger event to change the tracking circuit settings may be taken in the tracking controller 307. The first trigger signal T1 comprises a first frequency indication f1, which is formed by a central frequency of the specific filter of the bank of filters at which a reset event of the sweeping interference is detected and an indication of the speed of the sweeping interference, i.e. fast or slow.

Optionally the detector circuit 10 comprises a pre-filter circuit 15, which is connected between the input In and the mixers 101*d*, 102*d*, . . . , 1016*d*. The pre-filter circuit 15 may be realized as a static notch bank, which eliminates a possible fixed or slowly moving frequency interference from the input signal Sin.

The delay circuit 20 is configured, upon receiving the first trigger signal T1, to generate a second trigger signal T2 and provide this second trigger signal T2 to the tracker circuit 30 after an adjustable amount of time. Furthermore, the delay circuit 20 is configured to initialize the tracker circuit 30 during the adjustable amount of time. The second trigger signal T2 is a delayed version of the first trigger signal T1, and comprises a second frequency indication, which is derived from the first frequency indication f1. Details concerning the delay circuit 20 are explained below with reference to FIGS. 4 and 5.

The tracker circuit 30 is realized as a frequency locked loop, FLL. The tracker circuit 30 is configured to receive the input signal Sin or a delayed version thereof, which compensates for the group delay of the LPF in the detector circuit 10, here a first delayed input signal Sin1, and to start tracking the frequency of the sweeping interference contained in the input signal Sin or the first delayed input signal Sin1 as soon as the tracker circuit 30 receives the second trigger signal T2 using the second frequency indication f2 conveyed with the second trigger signal T2. The second frequency indication f2 has initialization values relating to the initial tracking frequency, as well as the speed of the sweeping interference.

As depicted in the exemplary embodiment, the tracker circuit 30 comprises a tracking loop circuit 309, which realizes the functionality of an FLL as known to those skilled in the art. The tracker circuit 30 further comprises a tracking control circuit 307 and a loss-of-tracking control circuit 308. The tracking loop circuit 309 estimates the current frequency of the sweeping interference tracked by the tracker circuit 30, and provides said estimated frequency as the third frequency indication f3 to the notch filter circuit 40.

The tracking control circuit 307 controls the operation of the tracker circuit 30, i.e. enabling and disabling the tracker circuit 30 in the presence or absence of an interference and setting the tracking circuit parameters. Specifically, the start of the tracking operation upon receipt of the second trigger signal T2 and initialization of the tracker circuit 30 are controlled by the tracking control circuit 307. Also, a possible reset of the tracker circuit 30 is controlled by this instance. In addition, it may use the information regarding the speed of the interference. Furthermore, a control signal T3 may be generated by the tracking control circuit 307 in response to receipt of the second trigger signal T2. Control signal T3 is made to control the notch filter circuit 40, for instance when there is no sweeping interference, by disabling it or by forcing it to a specific fixed location. In the case that no sweeping interference is present in the input signal Sin, the loss-of-tracking control circuit 308 may shut down the tracker circuit 30, i.e. stop its operation.

The notch filter circuit 40 in the depicted example comprises a notch NCO 41, a first mixer 42, a notch filter 43, a delay and conjugate block 44 and a second mixer 45. The notch NCO 41 is configured according to the third frequency indication f3 received from the tracker circuit 30 and the trigger signal T3. In the first mixer 42 the input signal Sin, or a second delayed input signal Sin2, is combined with a signal provided by the notch NCO 41 and is thereby down converted to baseband. The down-converted signal determined therefrom is provided to the notch filter 43, at the output of which a filtered signal is provided, from which the interference has been notched out. The signal generated by the notch NCO 41 is also passed through the delay and conjugate block 44 and is combined with the filtered signal from the notch filter 43 in the second mixer 40 for up conversion to intermediate frequency, for example. This results in the output signal Sout. Optionally, when there is no detected sweeping interference, the output signal Sout can be obtained by simply delaying the signal Sin2 by a delay equivalent to that of the notch filter.

The tracking loop 309 may provide a frequency output f3, which is delayed with respect to the current time. The introduction of the delay circuit 20 can be used to ensure that the trigger T2 will enable the tracking loop 309 to track the interference frequency until the associated reset event. By this, the adaptive filter device as proposed is enabled to track and largely eliminate a sweeping interference from its reset point until the end of the sweeping range, i.e. the next reset point in time. This achieves a highly reactive adaptive filter device. In the case that the adaptive filter device is employed in a receiver for a GNSS signal, the receiver is enabled to lock on a frequency of a sweeping interference before this interference comes close to the wanted GNSS signal.

Optionally, the adaptive filter device may additionally comprise a detector delay circuit 50 and a tracker delay circuit 60. The detector delay circuit 50 is coupled with its input to the input In of the adaptive filter device. It is configured to delay the input signal Sin to compensate for a delay introduced by the detector circuit 10 due to the detection and to provide a signal resulting therefrom as the first delayed input signal Sin1. If the detector delay circuit 50 is present in an implementation of the adaptive filter device, the first delayed input signal Sin1 is used as the input signal for the tracker circuit 30. The detector delay circuit 50 compensates a delay introduced in the data path of the input signal Sin by the low-pass filter bank employed in the detector circuit 10.

The tracker delay circuit 60 is configured to delay the first delayed input signal Sin1 according to a computation and delay time needed by the tracker circuit 30 in order to align the first delayed input signal Sin1 with the third frequency indication f3. A signal resulting therefrom is provided as the second delayed input signal Sin2 to the notch filter circuit 40. In the case that the tracker delay circuit 60 is used in an implementation of the adaptive filter device, the second delayed input signal Sin2 is used as input signal for the notch filter circuit 40.

The adaptive filter device also may comprise a delay control circuit 20*a*, which is coupled between the detector circuit 10 and the delay circuit 20. The delay control circuit 20*a* is configured to adjust the adjustable amount of time used in the delay circuit 20 in dependence on a relationship between the frequency of the sweeping interference and the frequency of a wanted signal and in dependence on the presence of a reset event within the sweeping interference. For this, when receiving the first trigger signal T1 having the first frequency indication f1, the delay control circuit 20*a* checks, whether the first frequency indication f1 indicates that the sweeping interference has a reset event. Otherwise, the delay control circuit 20 checks, whether the frequency of the interference is increasing and where said frequency is located in relation to the frequency of the wanted signal. More details shall be described in connection with FIGS. 2 and 3.

Figure 2:
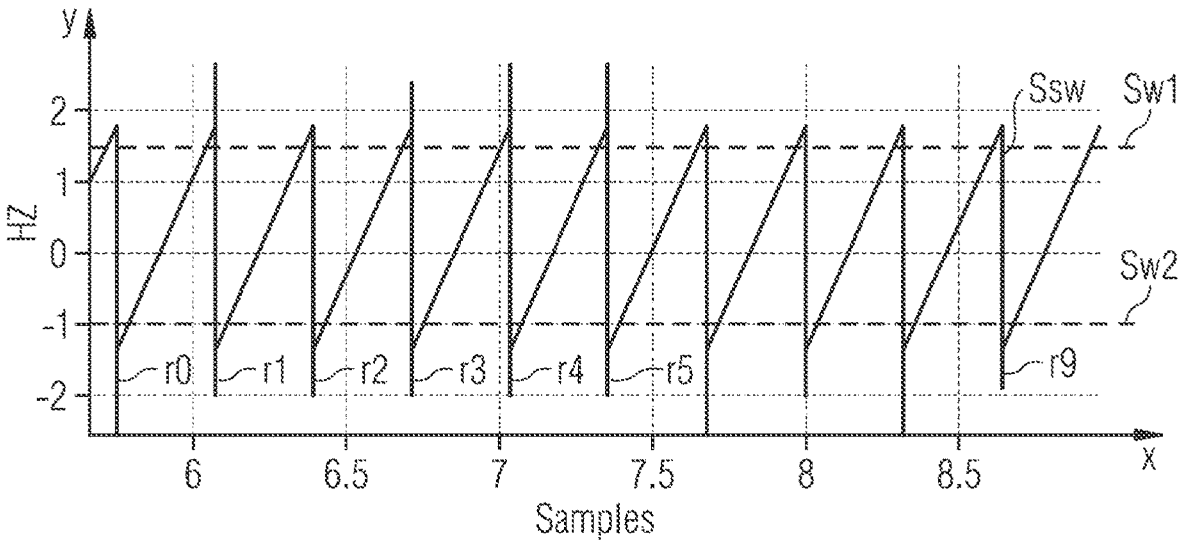
FIG. 2 shows an exemplary diagram of a sweeping interference signal.

FIG. 2 shows an exemplary diagram of a sweeping interference signal. Samples are depicted on the X-axis and the corresponding frequency in hertz is depicted on the Y-axis. It can be discerned that this sweeping interference signal Ssw has a saw tooth-like shape with frequency jumps or resets, herein called reset event, r0, r1, r2, . . . , r9 occurring at regular intervals and with nearly equal frequencies. In between these reset events r0 to r9 the frequency of the inference Ssw is increasing continuously. A frequency of a reset event r0, r1, r2, . . . , r9 represents the first frequency indication f1. Such a type of sweeping interference Ssw can be largely eliminated with the proposed adaptive filter device.

Two different possible wanted signals Sw1, Sw2 are also shown. The first wanted signal Sw1 has an approximately constant frequency which is higher than the approximately constant frequency of the second wanted signal Sw2. It can be determined that a crossing point of the frequency of the first wanted signal Sw1 with the interference Ssw resides before each of the resets r0, r1, r2, . . . , r9. In contrast to this, a crossing point of the frequency of the second wanted signal Sw2 with the interference Ssw resides just after each of the resets r0, r1, r2, . . . , r9. The delay control circuit 20*a* described above with reference to FIG. 1 enables different processing of sweeping interference signals depending—amongst others—on the relationship between the frequency of the wanted signal Sw1, Sw2 and the frequency of the interference Ssw. For example, in the case of the second wanted signal Sw2 the delay may be adjusted to zero.

Figure 3:
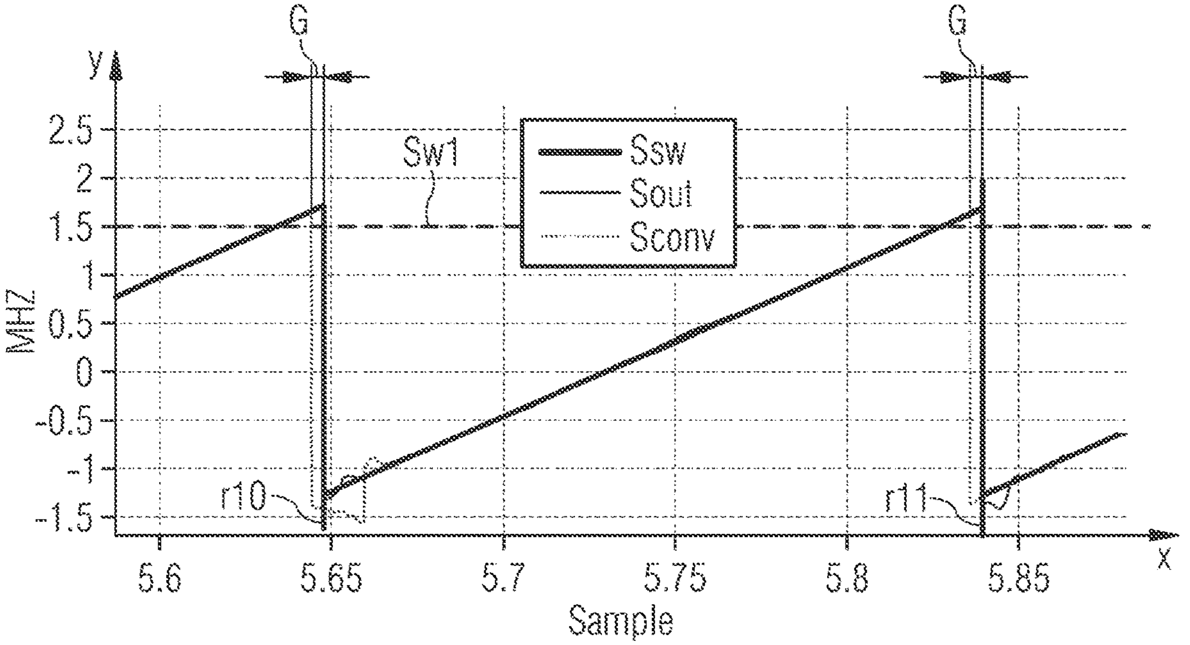
FIG. 3 shows exemplary diagrams of simulations in relation to a sweeping interference.

FIG. 3 shows exemplary diagrams of simulations in relation to a sweeping interference. As in FIG. 2, the number of samples is depicted on the X-axis, while the frequency is shown in megahertz on the Y-axis. The first line shows the sweeping interference Ssw. The second line shows a simulated output signal Sout produced by the adaptive filter device as proposed, for instance as shown in FIG. 1. The third line shows an output signal Sconv of a conventional filter. The wanted signal Sw1 is also shown. Its frequency lies within the bandwidth of the interference Ssw.

The sweeping interference Ssw has a first reset event r10 and a second reset event rl1. A crossing point of the frequency of the wanted signal Sw1 with the frequency of the interference Ssw is just before each of the reset events r10, r11. The adjustable amount of time used in the delay circuit of FIG. 1 is adjusted accordingly to a value above zero.

It can be discerned that the output signal Sout provided by the adaptive filter device as proposed correctly tracks the first and the second reset event, i.e. the reset event r10 and r11 are both detected at the right sample or point in time. Therefore, the lines of the signals Ssw and Sout collide most of the time, except for small artefacts after a reset event. In contrast to this, the output signal Sconv of a conventional filter determines or estimates a reset before the actual occurrence of the reset event r10, r11 and consequently is not able to correctly track the sweeping interference. This would typically occur when the tracking circuit outputs an estimate of the interference frequency with a delay compared to the frequency of the wanted signal. In this case, the detection of the frequency jump and the immediate reset of the tracking circuit would create this behaviour. A gap G between the real reset event r10 or r11 and the tracked signal can be discerned in each case. The gap G which is shown here as a gap in samples corresponds to a gap in time.

Due to the accurate initialization of the tracker circuit, for instance the tracker circuit 30, as depicted in FIG. 1, the adaptive filter device as proposed yields better precision of the sweeping interference's Ssw tracking. The delay circuit 20 can then be used to better eliminate the sweeping interference with respect to the location of the wanted signal.

Figure 4:
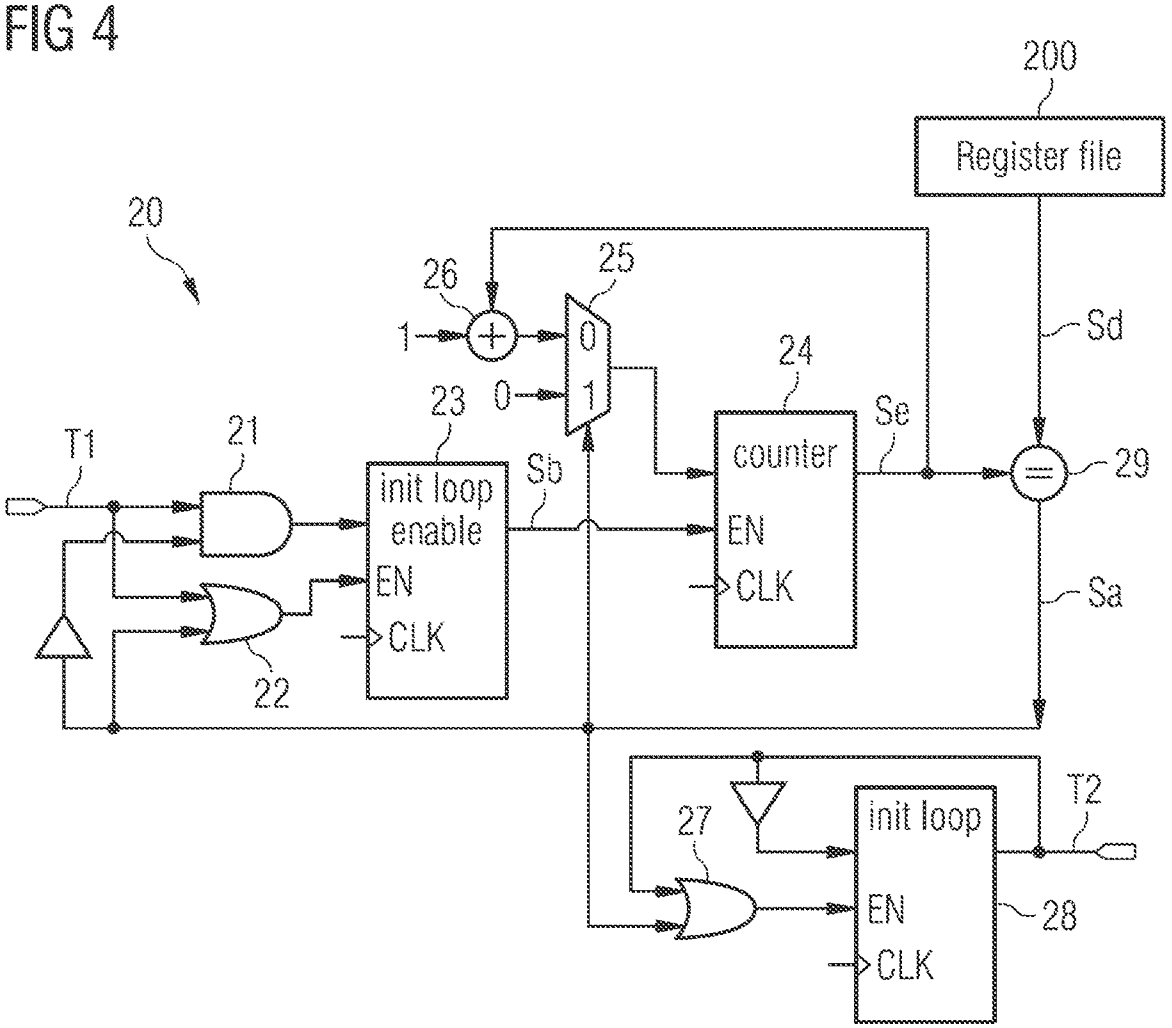
FIG. 4 shows an exemplary implementation of a delay circuit as proposed.

FIG. 4 shows an exemplary implementation of a delay circuit as proposed. The delay circuit 20, which may be used in the adaptive filter device shown in FIG. 1, comprises an input for receiving the first trigger signal T1 and an output for providing the second trigger signal T2. The delay circuit 20 further comprises an AND gate 21, a first OR gate 22, an enable circuit 23, a counter 24, a multiplexer 25, an adder 26, a second OR gate 27, a loop control 28, a comparator 29, a register 200, as well as, a first and a second NOT gate N1, N2.

The comparator 29 outputs a signal Sa. The enable circuit 23 outputs a signal Sb. A value from the register 200 is provided via delay signal Sd. The counter 24 provides a signal Se.

Functioning of the circuit will be explained below in relation to FIG. 5.

Figure 5:
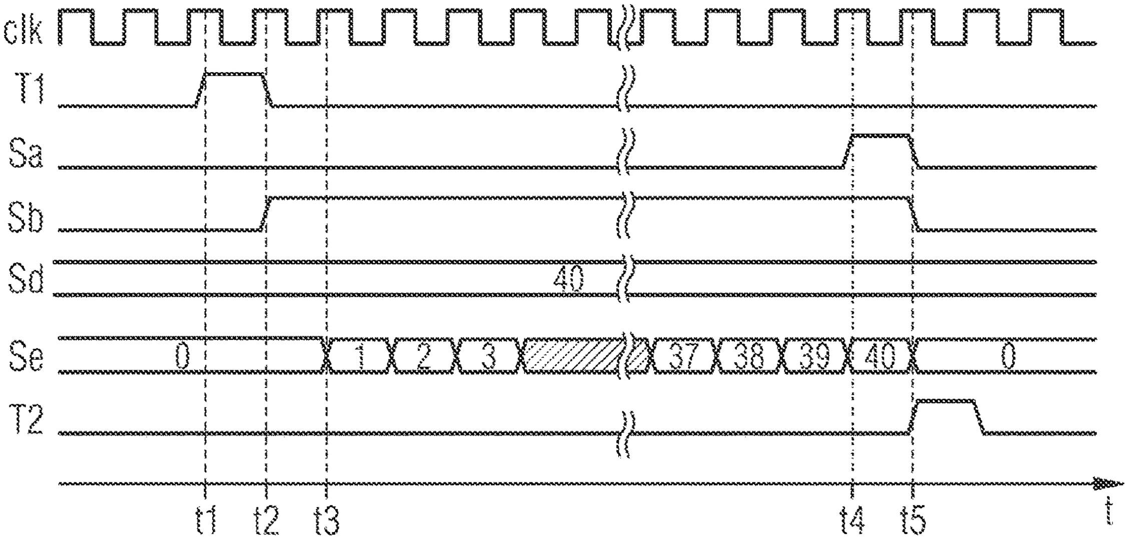
FIG. 5 shows exemplary timing diagrams for the implementation example of the delay circuit of FIG. 4.

FIG. 5 shows exemplary timing diagrams for the implementation example of the delay circuit 20 shown in FIG. 4. From top to bottom, different signals occurring in the delay circuit 20 are depicted in relation to time t, respectively. In the first line a clock signal clk is shown. The second line shows the first trigger signal T1, the third lines shows the signal Sa, the fourth line shows the signal Sb, the fifth line shows the delay signal providing the exemplary value 40, the sixth line shows the signal Se and the bottom line shows the second trigger signal T2.

Operation of the delay circuit 20 is started upon receipt of the first trigger signal T1 at point in time t1. The first trigger signal T1 enables the enable circuit 23 by means of the first OR gate 22. With the subsequent impulse of the clock signal clk, the signal Sb goes to high at point in time t2. This enables the counter 24, which starts counting at point in time t3 according to the clock signal clk. This is reflected in the signal Se. The comparator 29 continuously compares the actual count of the signal Se to the value provided from the register 200 As soon as this count reaches the value provided with the signal Sd, in this example 40, at point in time t4, the signal Sa is provided and propagated via the AND gate 21 to the enable circuit 23, which is consequently disabled. At point in time t5, the signal Sb goes back to low, which stops the counter 24. The signal Sa is also propagated via the second OR gate 27 to the loop control circuit 28. Consequently, with the next clock from the clock signal Clk, an output of the loop control circuit 28 goes to high at point in time t5, resulting in an impulse of the second trigger signal T2.

In short, when a frequency reset event is detected in detection circuit 10 of FIG. 1 and the first trigger signal T1 is generated, the counter 23 starts counting for a predefined number of clock cycles. Concurrently, the tracker circuit 30 in FIG. 1 is configured to the frequency of the sweeping interference using the second frequency indication f2.

The register 200 in the depicted example contains the value 40. In general, the value stored in register 200 reflects the adjustable amount of time for which the delay circuit 20 from FIG. 1 waits after having received the first trigger signal T1, until it forwards this first trigger signal T1 as the second trigger signal T2 to the tracker circuit 30 of FIG. 1.

Figure 6:
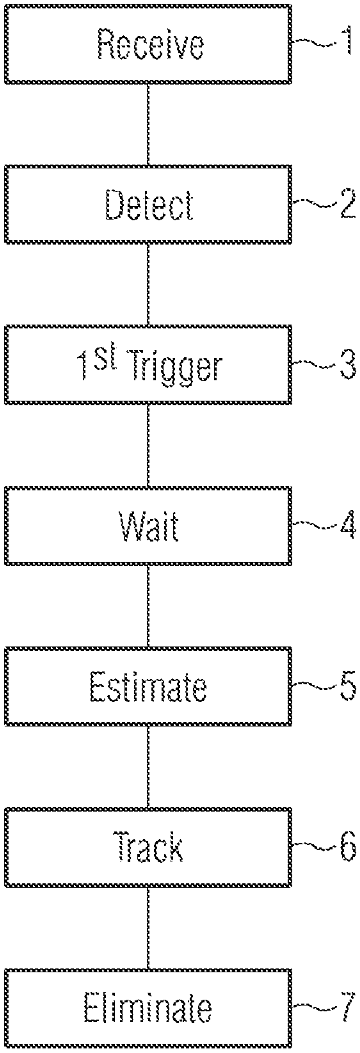
FIG. 6 shows an exemplary flowchart of the method as proposed.

FIG. 6 shows an exemplary flowchart of the method as proposed. The method for providing an output signal comprises the following steps:

1: receiving an input signal,

2: detecting a presence of a sweeping interference in the input signal,

3: providing a first trigger signal upon detection of such sweeping interference, wherein the first trigger signal comprises a first frequency indication, 4: waiting for an adjustable amount of time and then providing a second trigger signal having a second frequency indication, which is derived from the first frequency indication, 5: estimating a frequency of the sweeping interference using the second frequency indication upon receiving the second trigger signal, 6: tracking the estimated frequency and providing the estimated frequency as a third frequency indication, 7: substantially eliminating the sweeping interference from the input signal using the third frequency indication and therefrom providing the output signal.

By means of the proposed method a sweeping interference can be removed more efficiently from the input signal.

For detection of the presence of a sweeping interference a spectrum of the input signal may be scanned.

The method may be implemented by the adaptive filter device of FIG. 1.

It will be appreciated that the invention is not limited to the disclosed embodiments and to what has been particularly shown and described hereinabove. Rather, features recited in separate dependent claims or in the description may advantageously be combined. Furthermore, the scope of the invention includes those variations and modifications which will be apparent to those skilled in the art and fall within the scope of the appended claims. The term "comprising" used in the claims or in the description does not exclude other elements or steps of a corresponding feature or procedure. In the case that the terms "a" or "an" are used in conjunction with features, they do not exclude a plurality of such features. Moreover, any reference signs in the claims should not be construed as limiting the scope.

REFERENCE LIST

Sin, Sin1, Sin2, Sout, Ssw signal
101*a*, 102*a*, 1016*a* low-pass filter
101*c*, 102*c*, 1016*c*, 303, 41 NCO
101*d*, 102*d*, 1016*d*, 304, 42, 45 mixer
101*e*, 102*e*, 1016*e* signal T1, T2 trigger signal
In input
Out output
r0, r1, r2, r3, . . . , r10, r11 reset event
G gap
t1, t2, t3, t4, t5 point in time
Sa, Sb, Sd, Se signal
T3, Sconv, Sw, Sw1, Sw2, clk signal
f1, f2, f3 frequency indication
200 register
10 detector circuit
20 delay circuit
30 tracker circuit
40 notch filter circuit
50, 60 delay circuit
14, 15, 307, 308, 309, 44 circuit
21, 22, 27 logic gate
23 enable circuit
24 counter
25 multiplexer
26 adder
29 comparator
N1, N2 NOT gate
20*a* delay control circuit
1, 2, 3, 4, 5, 6, 7 step

The invention claimed is:

1. An adaptive filter device comprising:

a detector circuit;

a delay circuit;

a tracker circuit; and a notch filter circuit, the detector circuit configured to receive an input signal, to detect a presence of a sweeping interference in the input signal, and upon detection of such sweeping interference to provide a first trigger signal to the delay circuit, wherein the first trigger signal comprises a first frequency indication, the delay circuit configured, upon receiving the first trigger signal, to provide a second trigger signal to the tracker circuit after an adjustable amount of time, the second trigger signal having a second frequency indication, which is derived from the first frequency indication, the tracker circuit configured to receive the input signal or a delayed version thereof and further configured, upon receiving the second trigger signal, to estimate a frequency of the sweeping interference using the second frequency indication, to track the estimated frequency and provide the estimated frequency as a third frequency indication to the notch filter circuit, and the notch filter circuit configured to substantially eliminate the sweeping interference from the input signal using the third frequency indication and therefrom provide an output signal, wherein the delay circuit is further configured to initialize the tracker circuit during the adjustable amount of time.

2. The adaptive filter device according to claim 1, wherein the sweeping interference is represented by an interference signal which comprises a sweeping frequency which increases or decreases, the interference signal being comprised by the input signal.

3. The adaptive filter device according to claim 1, wherein the adjustable amount of time is realized as a pre-defined amount of time or is adjusted depending on at least a computation and delay time needed by the tracker circuit.

4. The adaptive filter device according to claim 1, wherein the detector circuit comprises a number of low-pass filters, which are jointly covering the spectrum of the input signal and are configured to scan the spectrum of the input signal in order to detect the presence of the sweeping interference, wherein the detector circuit further comprises a detection circuit being coupled downstream of the filters, wherein the detection circuit is configured to detect a speed of change of the sweeping interference.

5. The adaptive filter device according to claim 4, wherein a frequency of a specific filter of the number of low-pass filters, which detects the presence of the sweeping interference, together with an output of the detection circuit are used as the first frequency indication.

6. The adaptive filter device according to claim 1, wherein the tracker circuit is realized as a frequency locked loop (FFL), wherein the FLL is further configured according to the second frequency indication and operation of the FLL is started upon receiving the second trigger signal.

7. The adaptive filter device according to claim 1, wherein the notch filter circuit comprises a finite impulse response (FIR) filter, which is configured to receive the input signal or a delayed version thereof, the FIR filter being further configured to filter the input signal or its delayed version according to the third frequency indication (f3).

8. The adaptive filter device according to claim 1, wherein the input signal and the output signal each comprise a number of samples corresponding to a radio frequency signal, each sample comprising an in-phase value I and a quadrature value Q, forming an I/Q-sample.

9. The adaptive filter device according to claim 1, further comprising a detector delay circuit configured to delay the input signal according to a detector processing time needed by the detector circuit and to provide a signal resulting therefrom as a first delayed input signal to the tracker circuit.

10. The adaptive filter device according to claim 1, further comprising a tracker delay circuit which is configured to delay the first delayed input signal according to the computation and delay time needed by the tracker circuit and to provide a signal resulting therefrom as a second delayed input signal to the notch filter circuit, wherein the first delayed input signal is a delayed version of the input signal.

11. The adaptive filter device according to claim 1, further comprising a delay control circuit which is coupled between the detector circuit and the delay circuit, wherein the delay control circuit is configured to adjust the adjustable amount of time used in the delay circuit in dependence on a relationship between a frequency of the sweeping interference and a frequency of a wanted signal and in dependence on a presence of the frequency jump within the sweeping interference, wherein the sweeping interference and the wanted signal are both comprised by the input signal.

12. A receiver for a radio frequency signal, the receiver being realized as a Global Navigation Satellite System (GNSS) receiver, or a receiver for wireless communication, the receiver comprising an adaptive filter device that includes:

a detector circuit;

a delay circuit;

a tracker circuit; and a notch filter circuit, the detector circuit configured to receive an input signal, to detect a presence of a sweeping interference in the input signal, and upon detection of such sweeping interference to provide a first trigger signal to the delay circuit, wherein the first trigger signal comprises a first frequency indication, the delay circuit configured, upon receiving the first trigger signal, to provide a second trigger signal to the tracker circuit after an adjustable amount of time, the second trigger signal having a second frequency indication, which is derived from the first frequency indication, the tracker circuit configured to receive the input signal or a delayed version thereof and further configured, upon receiving the second trigger signal, to estimate a frequency of the sweeping interference using the second frequency indication, to track the estimated frequency and provide the estimated frequency as a third frequency indication to the notch filter circuit, and the notch filter circuit configured to substantially eliminate the sweeping interference from the input signal using the third frequency indication and therefrom provide an output signal, wherein the delay circuit is further configured to initialize the tracker circuit during the adjustable amount of time.

13. The receiver according to claim 12, wherein the detector circuit comprises a number of low-pass filters, which are jointly covering the spectrum of the input signal and are configured to scan the spectrum of the input signal in order to detect the presence of the sweeping interference, wherein the detector circuit further comprises a detection circuit being coupled downstream of the filters, wherein the detection circuit is configured to detect a speed of change of the sweeping interference.

14. The receiver according to claim 13, wherein a frequency of a specific filter of the number of low-pass filters, which detects the presence of the sweeping interference, together with an output of the detection circuit are used as the first frequency indication.

15. The receiver according to claim 14, wherein the tracker circuit is realized as a frequency locked loop (FFL) configured to receive the input signal or a delayed version thereof, the FLL is further configured according to the second frequency indication and operation of the FLL is started upon receiving the second trigger signal.

16. The receiver according to claim 15, wherein the notch filter circuit comprises a finite impulse response (FIR) filter, which is configured to receive the input signal or a delayed version thereof, the FIR filter being further configured to filter the input signal or its delayed version according to the third frequency indication.

17. The receiver according to claim 16, wherein the input signal and the output signal each comprise a number of samples corresponding to a radio frequency signal, each sample comprising an in-phase value I and a quadrature value Q, forming an I/Q-sample.

18. The receiver according to claim 17, further comprising a detector delay circuit configured to delay the input signal according to a detector processing time needed by the detector circuit and to provide a signal resulting therefrom as a first delayed input signal to the tracker circuit.

19. A method for providing an output signal comprising:

receiving an input signal, detecting a presence of a sweeping interference, providing a first trigger signal upon detection of such sweeping interference, wherein the first trigger signal comprises a first frequency indication, waiting for an adjustable amount of time and then providing a second trigger signal having a second frequency indication, which is derived from the first frequency indication, during the adjustable amount of time, initializing a tracker circuit, estimating, by the tracker circuit, a frequency of the sweeping interference using the second frequency indication upon receiving the second trigger signal, tracking, by the tracker circuit, the estimated frequency and providing the estimated frequency as a third frequency indication, substantially eliminating the sweeping interference from the input signal using the third frequency indication and therefrom providing the output signal.

* * * * *